United States Patent [19]

Aucoin

[11] Patent Number: 4,642,554
[45] Date of Patent: Feb. 10, 1987

[54] FAIL-SAFE ELECTRICAL-GROUND INDICATOR

[75] Inventor: Daniel A. Aucoin, Baton Rouge, La.

[73] Assignee: The Dow Chemical Company, Midland, Mich.

[21] Appl. No.: 694,876

[22] Filed: Jan. 25, 1985

[51] Int. Cl.⁴ ............................................. G01R 31/02
[52] U.S. Cl. ........................................ 324/51; 340/649
[58] Field of Search ................... 324/51; 340/649, 652

[56] References Cited

U.S. PATENT DOCUMENTS

| | | | |
|---|---|---|---|
| 3,290,668 | 12/1966 | Perretta | 340/649 |
| 3,343,154 | 9/1967 | Seesselberg | 340/255 |
| 3,769,577 | 10/1973 | Schnur et al. | 324/51 |
| 3,798,540 | 3/1974 | Darden et al. | 324/51 |
| 3,825,915 | 7/1974 | Dow | 340/256 |
| 3,878,458 | 4/1975 | Muska | 324/51 |
| 3,961,319 | 6/1976 | Asberry | 340/649 |
| 4,111,516 | 9/1978 | Wireman | 339/113 |
| 4,118,690 | 10/1978 | Paynton | 340/656 |
| 4,394,615 | 7/1983 | Rocci, Jr. | 324/51 |

Primary Examiner—Stanley T. Krawczewicz
Attorney, Agent, or Firm—Arthur J. Young

[57] ABSTRACT

A fail-safe electrical ground indicator is described which includes apparatus for testing whether a vessel or piece or equipment is adequately grounded. The indicator further includes grounded parallel resistors for checking the integrity of the test apparatus, means for making electrical contact between the test apparatus and each of the resistors one at a time, means for making electrical contact between the test apparatus and both resistors at the same time, means for determining whether an electrical current passing through the test apparatus and each of the resistors separately exceeds a specified value, and means for determining whether an electrical current passing through the test apparatus and all of the resistors exceeds the specified value.

12 Claims, 2 Drawing Figures

FAIL-SAFE ELECTRICAL-GROUND INDICATOR

BACKGROUND OF THE INVENTION

The present invention relates to electrical ground indicators. More particularly, the invention relates to apparatus and method for ensuring the integrity of electrical ground indicators.

Testing of equipment or vessels for electrical grounding is particularly important when a flammable or explosive liquid is transferred from one vessel to another. It is well known that, if the vessel or equipment is not electrically grounded, static electricity may cause a fire or explosion. Unfortunately, electrical ground indicators can lose their structural and electrical integrity without any outward evidence of such loss. When this occurs, the indicator may provide a false sense of security that a signal indicating a good ground has been established when, in fact, the equipment or vessel is not safely grounded.

SUMMARY OF THE INVENTION

In general, the present invention provides a device for checking the integrity of an electrical ground indicator instrument used to determine whether a vessel or other equipment is adequately grounded. The device includes a plurality of electrically grounded parallel resistors, means for making electrical contact between the instrument and each one of the resistors separately without making electrical contact with other resistors, means for making electrical contact between the instrument and all resistors simultaneously, means for determining whether an electrical current passing through the instrument and each separate resistor exceeds a specified value, and means for determining whether an electrical current passing through the instrument and all resistors at the same time exceeds the specified value, thereby providing an indication of the integrity of the instrument.

The invention also provides a fail-safe electrical ground indicator. The ground indicator includes apparatus and circuits for testing a vessel or other equipment for adequate grounding and, in addition, includes the device described above incorporated therein.

In addition, the invention provides a fail-safe method of testing the integrity of an electrical ground indicator. The method includes the steps of (a) making electrical contact between the ground indicator and each one of a plurality of grounded parallel resistors separately without making electrical contact with other resistors, (b) determining whether an electrical current passing through the ground indicator and each of the resistors separately exceeds a specified value, (c) making electrical contact between the ground indicator and all resistors at the same time, and (d) determining whether an electrical current passing through the ground indicator and all resistors exceeds the specified value, thereby providing an indication of the integrity of the electrical ground indicator.

These and other aspects of the invention will be apparent to those skilled in the art from the foregoing description and from the more detailed description which follows.

DESCRIPTION OF THE PREFERRED EMBODIMENTS

The following description illustrates the manner in which the principles of the present invention are applied, but is not to be construed as in any sense limiting the scope of the invention.

Figure 1:
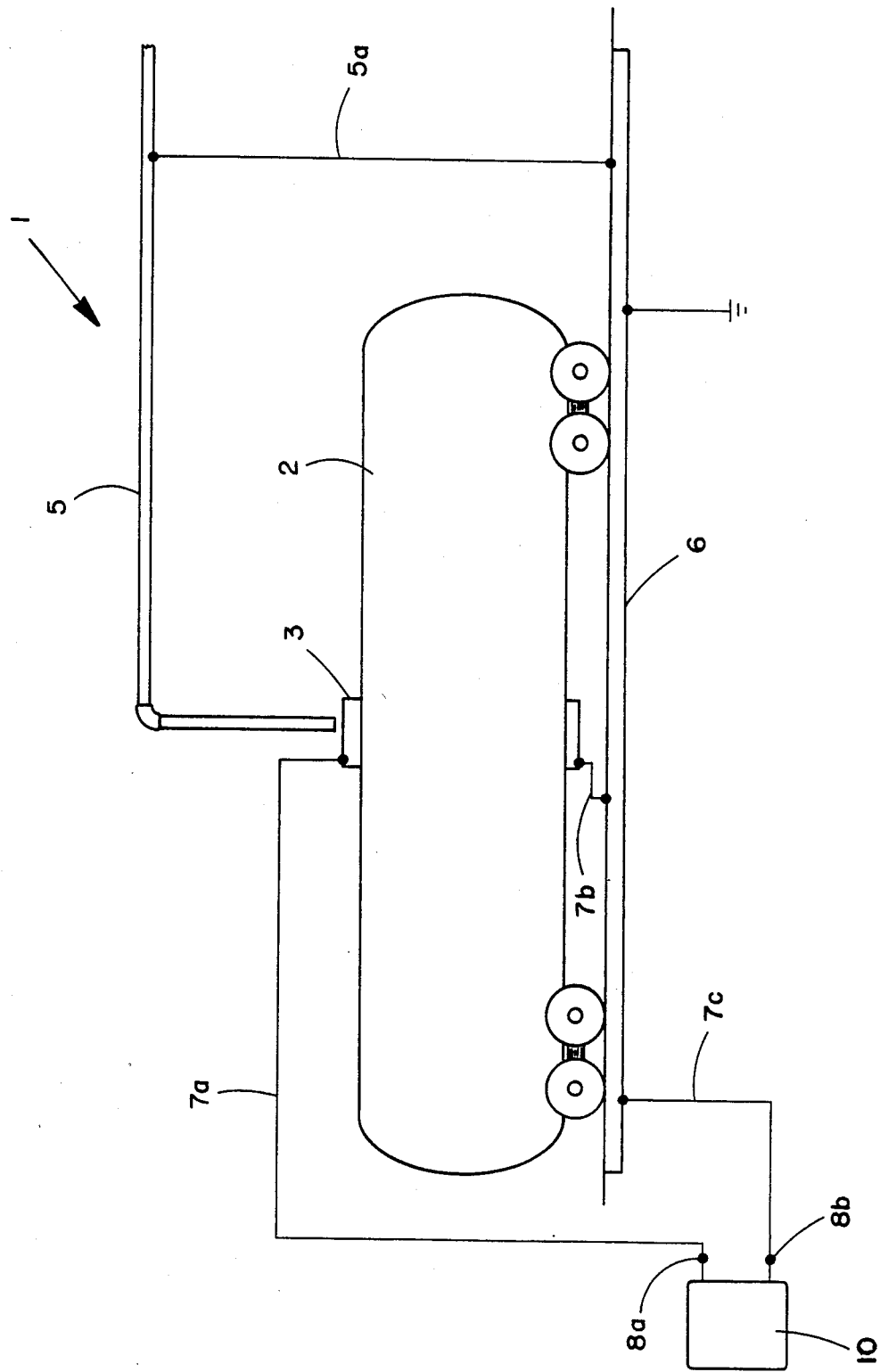
FIG. 1 is a schematic representation of a tank car, a loading platform, and an electrical ground indicator made in accordance with the principles of the present invention.

More specifically, FIG. 1 illustrates a loading station 1 for railroad tankcars that incorporates an electrical grounding system. A tankcar 2 is supported on a loading platform 6. The tankcar 2 includes a hatch 3 for receiving a fill pipe 5. Electrical wires or cables 7a, 7b and 7c electrically connect together the tankcar 2, platform 6, and the electrical ground indicator 10 through first and second leads 8a and 8b, respectively. The ground indicator 10 is used to make certain that a safe ground has been established between the tankcar 2 and the loading platform 6 by measuring the resistance to electrical current through the hatch 3, the car 2, and the platform 6. Fill pipe 5 has a permanent electrical ground to platform 6 through wire 5a. As is well known, if the grounds for the fill pipe 5 and tanker 2 are not well established, static electrical charge may accumulate on the fill pipe 5 and tankcar 2 which can cause a spark resulting in a fire or explosion.

It is often true that, by virtue of the construction of electrical ground indicators, it is possible for these indicators to lose their structural and electrical integrity over a period of time and service. When such a condition exists, the ground indicator is worse than useless since it provides a false sense of safety when, in fact, there may be a dangerous condition with respect to adequate grounding of the equipment being serviced.

Figure 2:
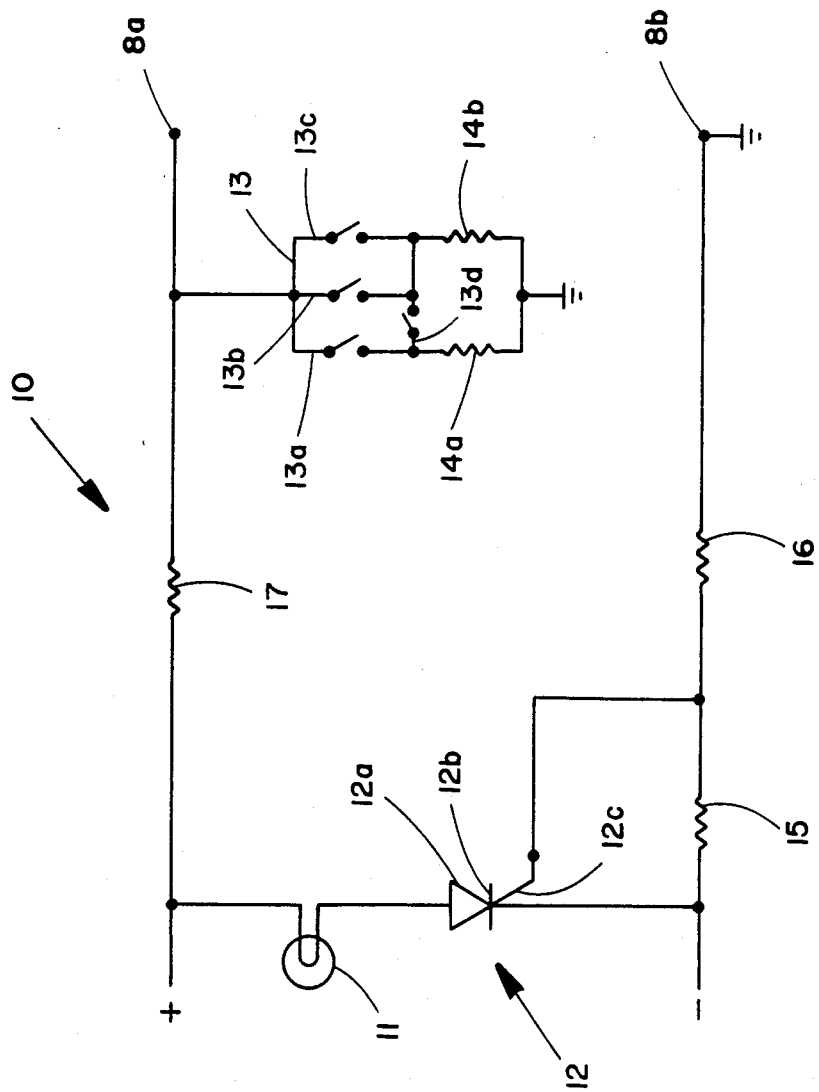
FIG. 2 is a simplified wiring diagram of a fail-safe electrical ground indicator made in accordance with the principles of the present invention.

In FIG. 2, the wiring diagram of a fail-safe electrical ground indicator 10 is illustrated in accordance with the principles of the present invention.

The fail-safe electrical ground indicator 10 of the present invention includes a test lamp 11, a silicon-controlled rectifier (SCR) 12, series resistors 15, and 16 and 17, an electrical manifold 13, a pair of parallel resistors 14a and 14b, and a source of direct electrical current (not shown). The SCR 12 is made up an anode 12a, a cathode 12b, and a gate 12c. The manifold 13 includes electrical switches 13a, 13b, 13c, and 13d. As shown, the parallel resistors 14a and 14b have a common ground.

Should the series resistor 15 be accidentally removed from the circuit as, for example, by burning out, the SCR 12 will bear the full voltage applied by the power source. Under these conditions, the SCR 12 will "fire," thereby illuminating the first lamp 11 and signalling a "good ground." The firing of the SCR 12 under these conditions would occur whether or not the vessel being checked is properly grounded. Thus a dangerous electrical condition might exist as the result of a false signal indicating adequate grounding be given by the ground indicator 10.

The present invention provides a fail-safe apparatus by utilizing the components 13, 13a, 13b, 13c, 13d, and 14a and 14b, to check the integrity of components 11, 12, 15, 16, and 17. Accordingly, before using the ground indicator 10 to determine proper grounding, a preliminary test is made by sequentially connecting the positive lead from the power source to each one of the parallel resistors 14 through switches 13a and 13c, and determining whether sufficient current passes to illuminate the lamp 11. When the integrity of components 11, 12, 15, 16, and 17 is intact, the lamp 11 will not be illuminated. Next, using switches 13b and 13d, the positive lead is connected to the parallel combination of both the resistors 14a and 14b. If the integrity of components 11, 12, 15, 16, and 17 is intact, the lamp 11 will now be illuminated.

Preferably, each of the parallel resistors 14a and 14b has substantially the same resistance, thereby making the equivalent parallel resistance approximately half the resistance of each resistor. The resistance of each resistor 14a and 14b is so chosen as to be greater than the required "ground resistance" but less than twice the value of the required "ground resistance." While the actual values of the various components may vary depending upon the specific conditions and circumstances of the required service, the following combination has been found to provide satisfactory functioning of the fail-safe electrical ground indicator 10 in the field: 500-600 ohms for each of the parallel resistors 15, twelve volts direct current across the input leads of the indicator 10, a cathode-gate SCR 12 firing at about one-half volt, and about fifty ohms for each of the series resistors 16 and 17.

While certain representative embodiments and details have been shown for the purpose for illustrating this invention, it will be apparent to those skilled in the art that various changes and modifications can be made therein without departing from the spirit and scope of the invention.

What is claimed is:

1. A device for checking the integrity of an electrical ground indicator used to determine whether a vessel or other equipment has adequate electrical grounding, comprising: a plurality of electrically grounded parallel resistors, means for making electrical contact between the indicator and each one of the resistors separately without making electrical contact with other resistors, means for making electrical contact between the indicator and all resistors simultaneously, means for determining whether an electrical current passing through the instrument and each separate resistor exceeds a specified value, and means for determining whether an electrical current passing through the indicator and all resistors at the same time exceeds the specified value, thereby providing an indication of the integrity of the instrument.

2. The device of claim 1, wherein each of the resistors has substantially the same resistance.

3. The device of claim 1, wherein the resistance of each separate resistor is greater than a specified value considered adequate for establishing a safe ground, but less than twice the specified value of the resistance.

4. The device of claim 1, wherein the resistance of each separate resistor is greater than a specified value considered adequate for establishing a safe ground, but less than twice the specified value of the resistance.

5. The device of claim 1, wherein the device is incorporated into the apparatus and circuits of a fail-safe electrical ground indicator used for determining the existence of an electrical ground on a vessel or other equipment.

6. The device of claim 2, wherein the device is incorporated into the apparatus and circuits of a fail-safe electrical ground indicator used for determining the existence of an electrical ground on a vessel or other equipment.

7. The device of claim 3, wherein the device is incorporated into the apparatus and circuits of a fail-safe electrical ground indicator used for determining the existence of an electrical ground on a vessel or other equipment.

8. The device of claim 4, wherein the device is incorporated into the apparatus and circuits of a fail-safe electrical ground indicator used for determining the existence of an electrical ground on a vessel or other equipment.

9. A fail-safe method of testing the integrity of an electrical ground indicator, comprising the steps of:
   (a) making electrical contact between the ground indicator and each one of a plurality of grounded parallel resistors separately without making electrical contact with the other resistors,
   (b) determining whether an electrical current passing through the ground indicator and each of the resistors separately exceeds a specified value,
   (c) making electrical contact between the ground indicator and all resistors at the same time, and
   (d) determining whether an electrical current passing through the ground indicator and all resistors exceeds the specified value, thereby providing in indication of the integrity of the electrical ground indicator.

10. The method of claim 9, wherein each of the resistors has substantially the same resistance.

11. The method of claim 9, wherein the resistance of each resistor is greater than a specified value considered adequate for establishing a safe ground, but less than twice the specified value of the resistance.

12. The method of claim 10, wherein the resistance of each resistor is greater than a specified value considered adquate for establishing a safe ground, but less than twice the specified value of the resistance.

* * * * *